(12) United States Patent
Guo et al.

(10) Patent No.: US 8,599,056 B2
(45) Date of Patent: Dec. 3, 2013

(54) DIGITAL-TO-ANALOG CONVERTER

(71) Applicant: Huawei Technologies Co., Ltd., Guangdong (CN)

(72) Inventors: Shubao Guo, Shenzhen (CN); Jun Chen, Shenzhen (CN); Gong Lei, Santa Clara, CA (US); Yongping Liu, Guangdong (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/728,884

(22) Filed: Dec. 27, 2012

(65) Prior Publication Data
US 2013/0181856 A1    Jul. 18, 2013

(30) Foreign Application Priority Data
Dec. 27, 2011 (CN) .......................... 2011 1 0444075

(51) Int. Cl.
*H03M 1/66* (2006.01)
(52) U.S. Cl.
USPC .......................................... 341/144; 341/145
(58) Field of Classification Search
USPC ......... 341/144, 145, 143, 155, 156, 118, 110, 341/136; 327/331, 156, 157, 158, 566, 313, 327/316, 109
See application file for complete search history.

(56) References Cited

U.S. PATENT DOCUMENTS 7,084,797 B2 *  8/2006  Yokoyama et al. ........... 341/143
2009/0251346 A1  10/2009  Kwan

* cited by examiner

*Primary Examiner* — Joseph Lauture (57) ABSTRACT

An embodiment of the present invention provides a digital-to-analog converter including: a primary modulator; a secondary modulator, connected to the primary modulator; a delay unit, connected to the primary modulator; a subtractor, connected to the delay unit and the secondary modulator separately; a first processing module, configured to perform decoding, dynamic matching, and digital-to-analog conversion in sequence on a B-bit digital signal output by the secondary modulator, so as to obtain a first analog signal; a second processing module, configured to perform decoding, dynamic matching, and digital-to-analog conversion in sequence on an (N−B+1)-bit quantization noise signal output by the subtractor, so as to obtain an analog noise signal; and an adder, connected to the first processing module and the second processing module separately, and configured to add the first analog signal and the analog noise signal, so as to obtain and output a second analog signal.

10 Claims, 5 Drawing Sheets

DIGITAL-TO-ANALOG CONVERTER

CROSS-REFERENCE TO RELATED APPLICATION

This application claims priority to Chinese Patent Application No. 201110444075.5, filed on Dec. 27, 2011, which is hereby incorporated by reference in its entirety.

FIELD OF THE INVENTION

The present invention relates to the field of electronic technologies, and in particular, to a digital-to-analog converter.

BACKGROUND OF THE INVENTION

A digital-to-analog converter (Digital-to-Analog Converter, DAC for short) converts a digital signal into an analog signal which may be sensed by people, and usually converts a digital code into a corresponding voltage signal through weighted summation. The DAC may be applied to, but not limited to, applications of video and image processing and the wireless field. The foregoing applications usually demand a high-speed and high-precision DAC, and the improvement of the speed and resolution usually increases design cost and power consumption. Therefore, it is particularly important to improve the performance of the DAC from a system and method level.

FIG. 1 is a schematic diagram of a typical oversampling SIGMA-DELTA DAC. As shown in FIG. 1, a SIGMA-DELTA modulator 102 converters an M-bit input signal 150 into an N-bit modulation signal through modulation, where M>N, and then a decoder 104 converts the N-bit modulation signal into a $2^N$-bit thermometer code, a scrambler 106 dynamically matches the thermometer code, and finally a DAC circuit 108 converts the dynamically matched code into an analog signal 152. When quantization bits of a quantizer in the modulator 102 increase from N to N+1 in number, output lines of the decoder 104 increase from $2^N$ to $2^{(N+1)}$ in number, and dynamic algorithm units in the scrambler 106 and DAC units in the DAC circuit 108 also double in number. For example, when N increases from 6 to 7, the output lines of the decoder 104 increase from 64 to 128 in number, and the dynamic algorithm units and the DAC units also increase from 64 to 128 in number.

In the prior art, there is a kind of DAC, which is equivalent to a cascaded modulator in structure, where the input of a latter stage is quantization noise output by a former stage, first stage quantization noise is finally offset through summation of an analog part, and finally, only high-order modulated quantization noise is left. In the structure, signals only exist in a first stage modulator, a latter stage modulator only includes noise, and noise in a band may be moved out of the band by increasing the order of the modulator, so noise out of the band is higher. If in-band noise and out-of-band noise are reduced on the whole, the main method is to adopt a quantizer with more quantization bits in the modulator.

However, an increase of the quantization bits of the quantizer brings non-ideal factors such as a static mismatching error of a current source and a non-ideal characteristic of a switch, and the factors may result in generation of a harmonic wave and deteriorate quality of an output signal. In addition, the increase of the quantization bits of the quantizer needs to correspondingly increase the number of the dynamic algorithm units and the DAC units, causing an increase to the power consumption and an overall DAC area.

SUMMARY OF THE INVENTION

An embodiment of the present invention provides a digital-to-analog converter, which is configured to reduce in-band noise and out-of-band noise and at the same time avoid the problem that an increase of quantization bits of a quantizer causes an increase to power consumption and an overall DAC area.

An embodiment of the present invention provides a digital-to-analog converter, which includes:

a primary modulator, configured to modulate an input M-bit digital signal into an N-bit digital signal, where M and N are positive integers, and M>N;

a secondary modulator, connected to the primary modulator, and configured to modulate the N-bit digital signal into a B-bit digital signal, where B is a positive integer, and B<N;

a delay unit, connected to the primary modulator, and configured to delay the N-bit digital signal;

a subtractor, connected to the delay unit and the secondary modulator separately, and configured to subtract the B-bit digital signal output by the secondary modulator from a delayed N-bit digital signal, so as to obtain an (N−B+1)-bit quantization noise signal;

a first processing module, configured to perform decoding, dynamic matching, and digital-to-analog conversion in sequence on the B-bit digital signal output by the secondary modulator, so as to obtain a first analog signal;

a second processing module, configured to perform decoding, dynamic matching, and digital-to-analog conversion in sequence on the (N−B+1)-bit quantization noise signal output by the subtractor, so as to obtain an analog noise signal; and an adder, connected to the first processing module and the second processing module separately, and configured to add the first analog signal and the analog noise signal, so as to obtain and output a second analog signal.

In the embodiments of the present invention, the technical solution of cascading a secondary modulator with less quantization bits behind the primary modulator is adopted, avoiding the problem that excessive quantization bits of the primary modulator cause an increase to power consumption and an overall DAC area, and reducing non-ideal factors such as a static mismatching error of a current source and a non-ideal characteristic of a switch; and the technical solution is adopted that the second processing module processes the quantization noise signal obtained by subtracting the output signal of the secondary modulator from the output signal of the primary modulator so as to obtain the analog noise signal, and adds the analog noise signal with the first analog signal obtained from that the first processing module processes the output of the secondary modulator so as to obtain the second analog signal, so in-band noise and out-of-band noise may be reduced, so as to obtain a lower total harmonic distortion.

BRIEF DESCRIPTION OF THE DRAWINGS

To illustrate the technical solutions in the embodiments of the present invention or in the prior art more clearly, the following briefly describes the accompanying drawings needed for describing the embodiments or the prior art. Apparently, the accompanying drawings in the following description show some embodiments of the present invention, and persons skilled in the art may derive other drawings from these accompanying drawings without creative efforts.

FIG. 1b is a schematic structural diagram of a first processing module according to the embodiment shown in FIG. 1a;

FIG. 1c is a schematic structural diagram of a second processing module according to the embodiment shown in FIG. 1a;

FIG. 5 is another schematic structural diagram of the first processing module according to the embodiment shown in FIG. 1a;

DETAILED DESCRIPTION OF THE EMBODIMENTS

To make the objectives, technical solutions, and advantages of the present invention more comprehensible, the following clearly describes the technical solutions according to the embodiments of the present invention with reference to the accompanying drawings in the embodiments of the present invention. Apparently, the embodiments in the following description are merely a part of rather than all the embodiments of the present invention. All other embodiments obtained by persons skilled in the art based on the embodiments of the present invention without creative efforts shall fall within the protection scope of the present invention.

Figure 1A:
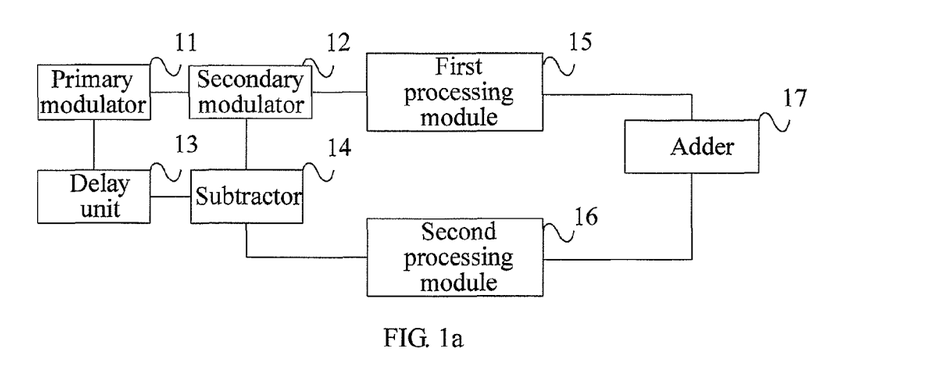
FIG. 1a is a schematic structural diagram of a digital-to-analog converter according to an embodiment of the present invention.

FIG. 1a is a schematic structural diagram of a digital-to-analog converter according to an embodiment of the present invention. As shown in FIG. 1a, the digital-to-analog converter includes:

a primary modulator 11, configured to modulate an input M-bit digital signal into an N-bit digital signal, where M and N are positive integers, and M>N;

a secondary modulator 12, connected to the primary modulator 11, and configured to modulate the N-bit digital signal into a B-bit digital signal, where B is a positive integer, and B<N;

a delay unit 13, connected to the primary modulator 11, and configured to delay the N-bit digital signal;

a subtractor 14, connected to the delay unit 13 and the secondary modulator 12 separately, and configured to subtract the B-bit digital signal output by the secondary modulator from the delayed N-bit digital signal, so as to obtain an (N−B+1)-bit quantization noise signal;

a first processing module 15, configured to perform decoding, dynamic matching, and digital-to-analog conversion in sequence on the B-bit digital signal output by the secondary modulator 12, so as to obtain a first analog signal;

a second processing module 16, configured to perform decoding, dynamic matching, and digital-to-analog conversion in sequence on the (N−B+1)-bit quantization noise signal output by the subtractor 14, so as to obtain an analog noise signal; and an adder 17, connected to the first processing module 15 and the second processing module 16 separately, and configured to add the first analog signal and the analog noise signal, so as to obtain and output a second analog signal.

Specifically, the secondary modulator 12 may be implemented by adopting a first-order or high-order modulator, and exemplarily, to simplify the circuit design, the first-order modulator is adopted for implementation. Assuming that an output signal of the primary modulator 11 is A, a noise transfer function NTF of the secondary modulator 12 is H1, and quantization noise is E1, an output signal of the secondary modulator 12 is B=A+H1*E1; and the subtractor 14 subtracts the output signal of the secondary modulator 12 from the delayed output signal of the primary modulator 11 so as to obtain the quantization noise signal being −H1*E1, which may be expressed as (N−B+1) bits. The output signal of the secondary modulator 12 and the quantization noise signal, after being processed by the first processing module 15 and the second processing module 16 respectively, are converted into analog signals which are added, and finally an output signal A of the digital-to-analog converter is obtained.

Figure 1B:
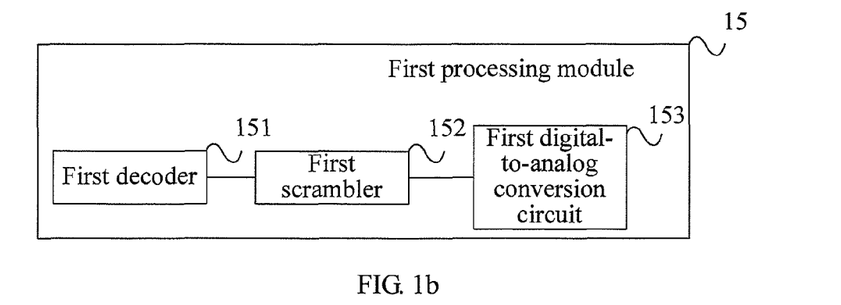
Figure 1C:
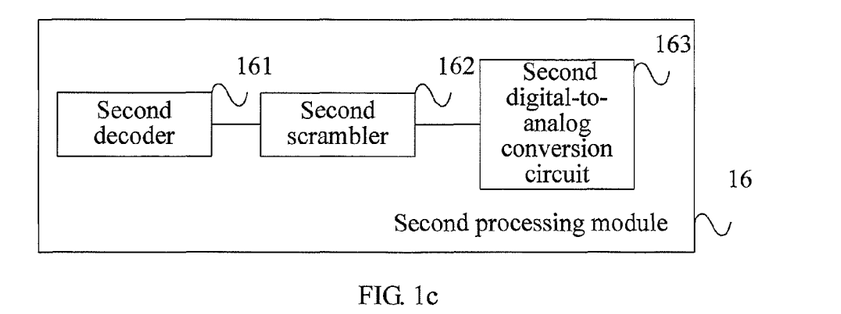

Usually, the processing module may be formed of a decoder, a scrambler, and a digital-to-analog conversion circuit. FIG. 1b is a schematic structural diagram of the first processing module according to the embodiment shown in FIG. 1a. FIG. 1c is a schematic structural diagram of the second processing module according to the embodiment shown in FIG. 1a. As shown in FIG. 1b and FIG. 1c, the first processing module 15 includes a first decoder 151, a first scrambler 152, and a first digital-to-analog conversion circuit 153, which are connected in sequence, and the second processing module 16 includes a second decoder 161, a second scrambler 162, and a second digital-to-analog conversion circuit 163 which are connected in sequence.

For example, if the output signal of the primary modulator 11 has 7 bits (bits), the output signal of the secondary modulator 12 has 4 bits, a subtracted quantization noise signal has N−B+1=4 bits. In this way, the DAC units in the first digital-to-analog conversion circuit may be reduced from 2^7=128 originally to 2^4=32 in number, and though 2^4=32 DAC units are also needed in the second digital-to-analog conversion circuit, the total number of the DAC units is only 32+32=64, much less than 128. In addition, because the 4-bits signal output by the subtractor 14 is a noise signal rather than a data signal, the problem that two paths of harmonic waves are added is not caused at the adder 17, and the reduction of the data signal from 7 bits to 4 bits facilitates reduction of non-ideal factors such as a static mismatching error and a non-ideal characteristic of a switch.

To reduce the total number of the DAC units as much as possible, under the circumstance that N is a certain number, 2^B+2^(N−B+1) needs to be minimized, that is, when N is an odd number, the value of B is (N+1)/2, and when N is an even number, the value of B is N/2 or N/2+1.

Figure 2:
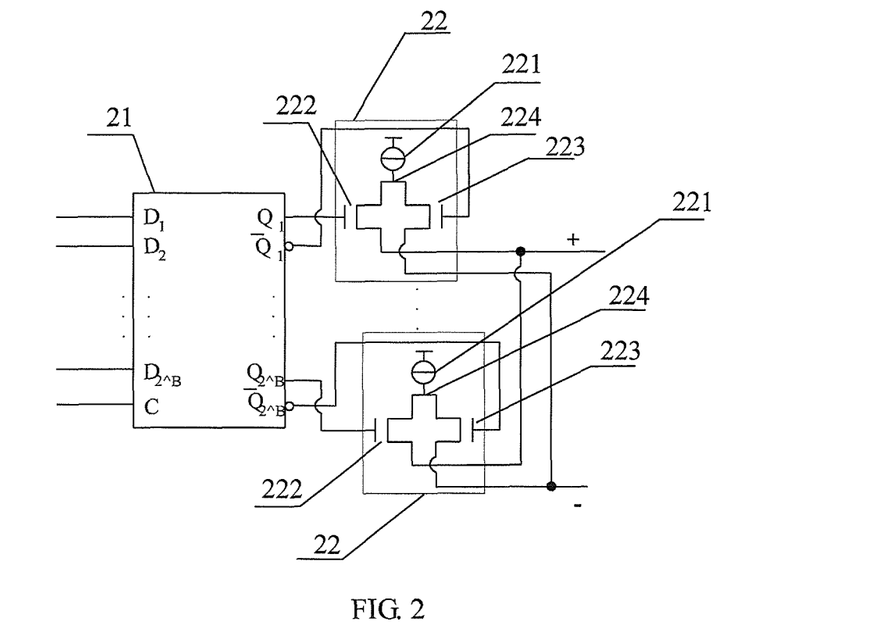
FIG. 2 is a schematic circuit diagram of a first digital-to-analog conversion circuit according to the embodiment shown in FIG. 1b.

FIG. 2 is a schematic circuit diagram of the first digital-to-analog conversion circuit according to the embodiment shown in FIG. 1b. As shown in FIG. 2, the first digital-to-analog conversion circuit 153 includes:

a first latch (LATCH) 21, configured to output, according to a first conversion control signal output by the first scrambler 152, 2^B pairs of first control signals and second control signals, where in each pair, a first control signal and a second control signal are reverse to each other; and 2^B first DAC units 22, configured to perform digital-to-analog conversion according to the 2^B pairs of first control signals and second control signals output by the first latch 21, respectively, so as to obtain the first analog signal, where each first DAC unit 22 includes:

a first current source 221, a first metal-oxide-semiconductor field-effect transistor (Metal-Oxide-Semiconductor Field-Effect Transistor, MOSFET for short) 222, and a second MOSFET 223, where the first current source 221 is connected to sources of the first MOSFET 222 and the second MOSFET 223 separately through a first summation point 224, the drain of the first MOSFET 222 and the drain of the second MOSFET 223 are connected to an output positive end and an output negative end of the first DAC unit 22 respectively, the gate of the first MOSFET 222 and the gate of the second MOSFET 223 are connected to the first latch 21 separately to receive the input first control signal and second control signal, and the first MOSFET 222 and the second MOSFET 223 are negative (N type) MOSFETs with a same parameter.

Specifically, that the first control signal and the second control signal are "reverse" to each other refers to that when the first control signal is a high level, the second control signal is a low level, and vice versa.

Figure 3:
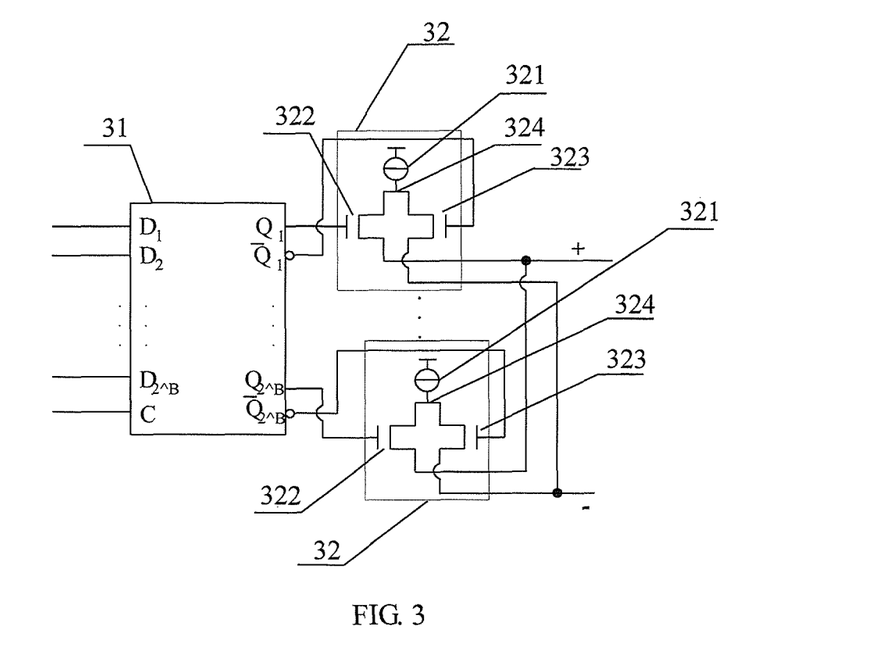
FIG. 3 is a schematic circuit diagram of a second digital-to-analog conversion circuit according to the embodiment shown in FIG. 1c.

FIG. 3 is a schematic circuit diagram of the second digital-to-analog conversion circuit according to the embodiment shown in FIG. 1c. As shown in FIG. 3, the second digital-to-analog conversion circuit 163 includes:

a second latch 31, configured to output $2^B$ pairs of third control signals and fourth control signals according to a second conversion control signal output by the second scrambler 162, where in each pair, a third control signal and a fourth control signal are reverse to each other; and $2^B$ second DAC units 32, configured to perform digital-to-analog conversion according to the $2^B$ pairs of third control signals and fourth control signals output by the second latch 31, respectively, so as to obtain the analog noise signal, where each second DAC unit 32 includes:

a second current source 321, a third MOSFET 322, a fourth MOSFET 323, where the second current source 321 is connected to sources of the third MOSFET 322 and the fourth MOSFET 323 separately through a second summation point 324, the drain of the third MOSFET 322 and the drain of the fourth MOSFET 323 are connected to an output positive end and an output negative end of the second DAC unit respectively, gates of the third MOSFET 322 and the fourth MOSFET 323 are connected to the second latch 31 separately to receive the input third control signal and fourth control signal, and the third MOSFET 322 and the fourth MOSFET 323 are negative (N type) MOSFETs with the same parameter.

Usually, a current signal output by the first digital-to-analog conversion circuit 153 and the second digital-to-analog conversion circuit 154 may be further converted into a voltage signal through a current-to-voltage converter. Correspondingly, the digital-to-analog converter further includes:

$2^B$ first current-to-voltage converters and $2^B$ second current-to-voltage converters, where the output positive end and the output negative end of each first DAC unit 22 are connected to the adder 17 through a corresponding first current-to-voltage converter, and the output positive end and the output negative end of each second DAC unit 32 are connected to the adder 17 through a corresponding second current-to-voltage converter.

Figure 4:
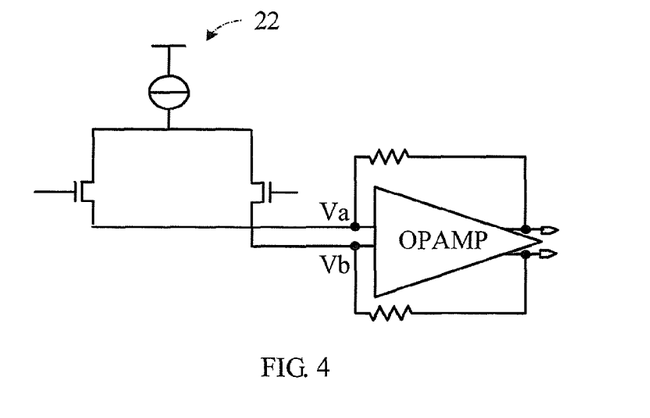
FIG. 4 is a schematic circuit diagram of a first DAC unit and an operational amplifier.

Specifically, both the first current-to-voltage converter and the second current-to-voltage converter may be implemented by an operational amplifier. FIG. 4 is a schematic circuit diagram of a first DAC unit and an operational amplifier. As shown in FIG. 4, the output positive end and the output negative end of the first DAC unit 22 are connected to two input ends of the operational amplifier (Operational Amplifier, OPAMP for short) respectively. Assuming that the operational amplifier is ideal, voltages Va and Vb of the two input ends of the operational amplifier are equal, but under a deep sub-micrometer technology, a demand for wide bandwidth and a high gain usually complicates the design of the operational amplifier, and the power consumption may be increased. Therefore, the voltages of the two input ends Va and Vb usually change as an output current of the DAC unit changes; and under the circumstance of dynamic element matching (Dynamic Element Matching, DEM for short), a voltage difference between the voltages Va and Vb of the two input ends generates signal-related charge transfer through a parasitic capacitor at a drain end of a current source, resulting in generation of a harmonic wave.

Figure 5:
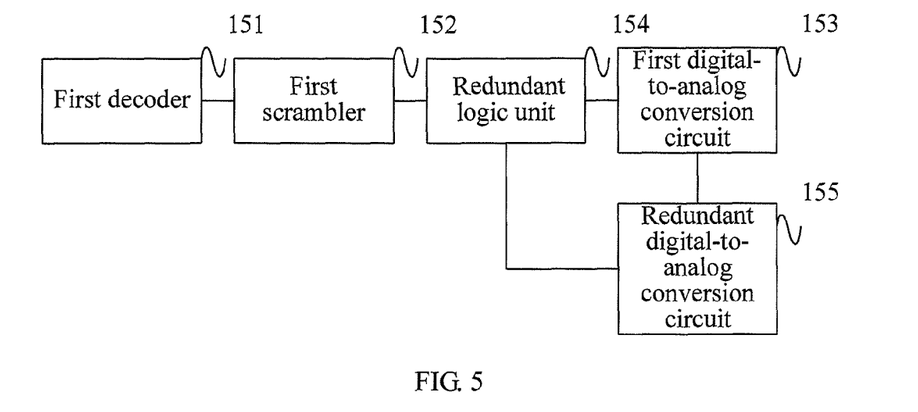

To constrain the harmonic wave generated due to the voltage difference between the voltages Va and Vb of the two input ends of the operational amplifier, in an optional embodiment of the present invention, a redundant circuit which is the same as the first digital-to-analog conversion circuit is added in the first processing module 15, so that there is the same charge transfer in each preset period, thus an error of the charge transfer is not related to a frequency of an input signal, that is, by injecting the same charge energy in each preset period, an original harmonic wave may be converted into high-frequency noise, a latter stage filter may remove the noise through filtering, and finally a high-performance output signal is obtained. FIG. 5 is another schematic structural diagram of the first processing module according to the embodiment shown in FIG. 1a. As shown in FIG. 5, based on the embodiment shown in FIG. 1b, the first processing module 15 further includes:

a redundant logic unit 154, connected to the first scrambler 152 and the first digital-to-analog conversion circuit 153, and configured to perform redundant logic processing according to a conversion control signal output by the first scrambler 152, and output a conversion control signal and a redundant control signal, where the conversion control signal and the redundant control signal are redundant to each other; and a redundant digital-to-analog conversion circuit 155, connected to the redundant logic unit 154 and the first digital-to-analog conversion circuit 153, and configured to perform digital-to-analog conversion according to the redundant control signal, so as to obtain a redundant analog signal.

Specifically, redundant digital-to-analog conversion circuit 155 includes:

a third latch, configured to output $2^B$ pairs of fifth control signals and sixth control signals according to the redundant control signal, where in each pair, a fifth control signal and a sixth control signal are reverse to each other, the fifth control signal and the first control signal are redundant to each other, and the sixth control signal and the second control signal are redundant to each other;

$2^B$ redundant conversion units, corresponding to the $2^B$ first DAC units, and configured to perform digital-to-analog conversion according to the $2^B$ pairs of fifth control signals and sixth control signals output by the third latch, respectively, so as to obtain the redundant analog signal, where each redundant conversion unit includes:

a third summation point in a high impedance state, a fifth MOSFET and a sixth MOSFET, where the third summation point is connected to sources of the fifth MOSFET and the sixth MOSFET separately, the drain of the fifth MOSFET and the drain of the sixth MOSFET are connected to the output positive end and output negative end of the corresponding first DAC unit respectively, and the fifth control signal and the sixth control signal are input to the gate of the fifth MOSFET and the gate of the sixth MOSFET respectively.

Here the third summation point in the high impedance state may be implemented by adopting a method in the prior art, for example, the third summation point is connected to a drain of a seventh MOSFET, a source and a gate of the seventh MOSFET are grounded, and the seventh MOSFET is a positive (P type) MOSFET.

That the fifth control signal and the first control signal are redundant to each other refers to that in every preset period, a sum of times of isotropic level jumps of the fifth control signal and the first control signal is equal to 1, that is, an isotropic level jump of the first control signal or the fifth control signal exists in every preset period, namely, in every preset period, the sum of times of level jumps from low to high of the fifth control signal and the first control signal is equal to 1, or the sum of times of level jumps from high to low of the fifth control signal and the first control signal is equal to 1. That the sixth control signal and the second control signal are redundant to each other refers to that in every preset period, a sum of times of isotropic level jumps of the sixth control signal and the second control signal is equal to 1, that is, an isotropic level jump of the second control signal or the sixth control signal exists in every preset period, namely, in every preset period, the sum of times of level jumps from low to high of the sixth control signal and the second control signal is equal to 1, or the sum of times of level jumps from high to low of the sixth control signal and the second control signal is equal to 1.

The first MOSFET 222, the second MOSFET 223, the fifth MOSFET, and the sixth MOSFET have the same parameter, so that a capacitance of the parasitic capacitor of the first summation point 224 in the first DAC unit 22 is equal to a capacitance of the parasitic capacitor of the third summation point in the redundant conversion unit. Assuming that the capacitances of the parasitic capacitors of both the first summation point 224 and the third summation point are C, and in every preset period, an absolute value of the voltage change of the first control signal or the fifth control signal is $\Delta V$, and correspondingly, an absolute value of the voltage change of the second control signal or the sixth control signal is also $\Delta V$, in every preset period, the charge amount transferred from the output positive end of the first DAC unit to the output negative end through the first summation point or the third summation point is $C*\Delta V$, or in every preset period, the charge amount transferred from the output negative end to the output positive end through the first summation point or the third summation point 221 is $C*\Delta V$. The preset period here may be exemplarily set as the double of the clock period.

Figure 6:
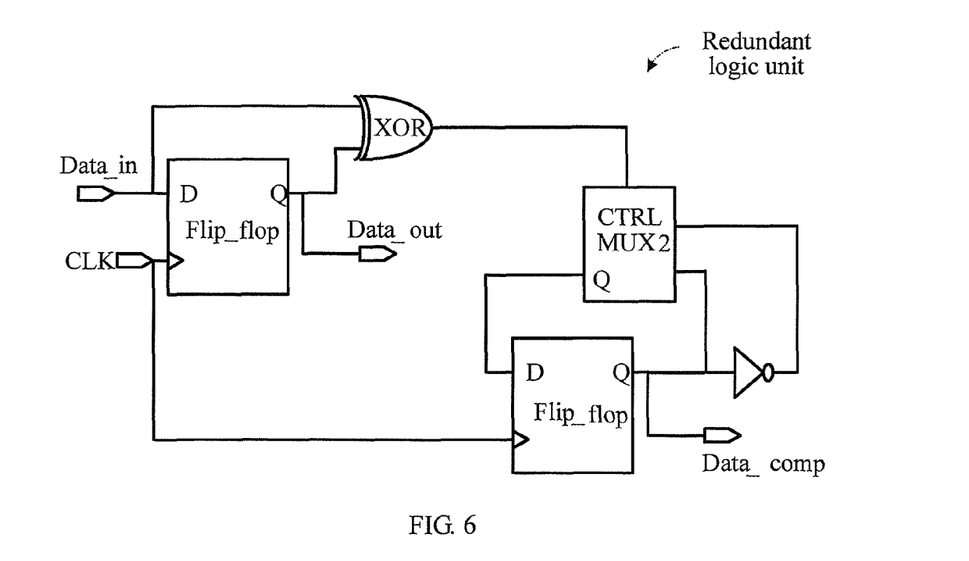
FIG. 6 is a schematic circuit diagram of a redundant logic unit according to an embodiment shown in FIG. 5.
Figure 7:
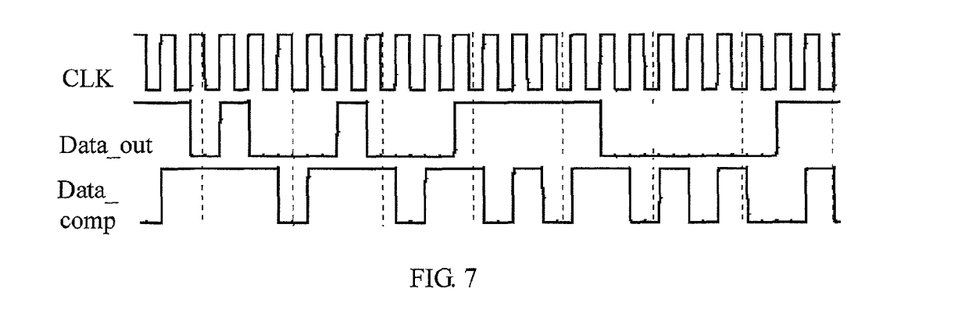
FIG. 7 is a signal timing diagram of the redundant logic unit shown in FIG. 6.

FIG. 6 is a schematic circuit diagram of a redundant logic unit according to the embodiment shown in FIG. 5. As shown in FIG. 6, Flip_flop is a trigger, XOR is an XOR operation unit, MUX2 is a multiplexer, and the redundant logic unit receives a conversion control signal Data_in output by the first scrambler, and after the redundant logic processing is performed on the conversion control signal, a conversion control signal Data_out and a redundant control signal Data_comp which are redundant to each other are obtained. In an application, a jump of the conversion control signal and the redundant control signal may not be implemented strictly according to the preset period. FIG. 7 is a signal timing diagram of the redundant logic unit shown in FIG. 6. As shown in FIG. 7, CLK is a clock signal, Data_out is used to generate a switch signal controlling the MOSFET of the first DAC unit in the first digital-to-analog conversion circuit, namely, the first control signal and the second control signal, and Data_comp is used to generate a switch signal controlling the MOSFET of the redundant conversion unit in the redundant digital-to-analog conversion circuit, namely, the fifth control signal and the sixth control signal. As long as the switch signal is converted once from low to high or from high to low, charge transfer is generated once. After the redundant logic unit and the redundant digital-to-analog conversion circuit are added, as long as no charge is transferred from the first DAC unit to the output positive end or the output negative end, a corresponding redundant conversion unit transfers the charge to the output positive end or the output negative end. The main part of energy of the charge transfer generated by the timing shown in FIG. 7 is concentrated at about Fs/2, where Fs is a frequency of CLK, namely, a sampling frequency; and the part of energy may be removed by a latter stage low-pass filter through filtering.

To improve the amplitude of the output signal, in another optional embodiment of the present invention, a circuit which is similar to the circuit shown in FIG. 3 is symmetrically added in the first DAC unit, also a similar circuit is added in the redundant conversion unit correspondingly, so as to form a fully differential first DAC unit and a fully differential redundant conversion unit. Specifically, the first DAC unit further includes: a current sink, an eighth MOSFET and a ninth MOSFET, where the current sink is connected to sources of the eighth MOSFET and the ninth MOSFET separately through a fourth summation point, the drain of the eighth MOSFET and the drain of the ninth MOSFET are connected to the output positive end and the output negative end of the first digital-to-analog conversion circuit respectively, and the second control signal and the first control signal are input to the gate of the eighth MOSFET and the gate of the ninth MOSFET respectively.

The redundant conversion unit further includes: a tenth MOSFET, an eleventh MOSFET, and a twelfth MOSFET, where a drain of the tenth MOSFET is connected to sources of the eleventh MOSFET and the twelfth MOSFET separately through a fifth summation point, the drain of the eleventh MOSFET and the drain of the twelfth MOSFET are connected to the output positive end and the output negative end of the first digital-to-analog conversion circuit respectively, the sixth control signal and the fifth control signal are input to the gate of the eleventh MOSFET and the gate of the twelfth MOSFET respectively, and the source and the gate of the tenth MOSFET are grounded.

The eighth MOSFET, the ninth MOSFET, and the eleventh MOSFET, and the twelfth MOSFET are N-type MOSFETs with the same parameter, and the tenth MOSFET is an N-type MOSFET.

Figure 8:
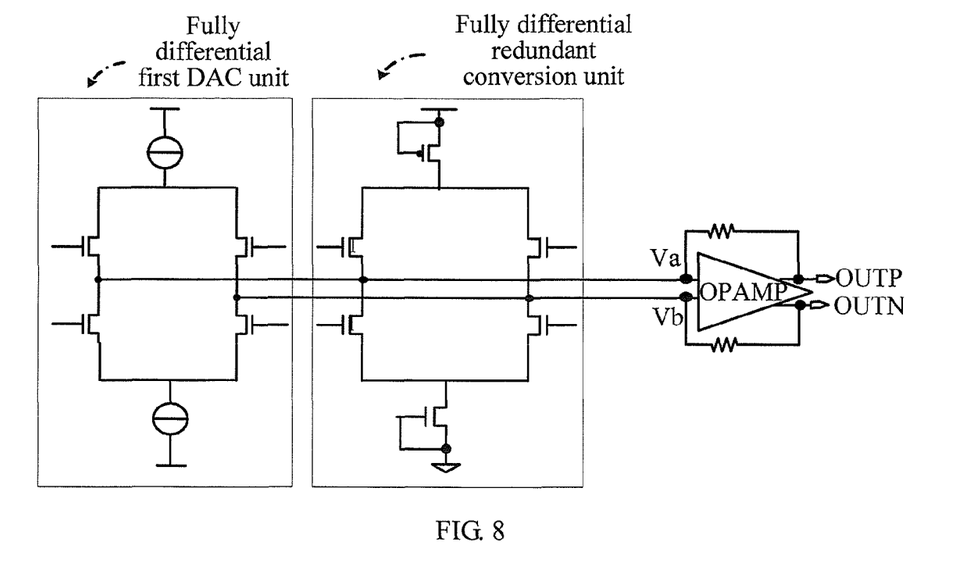
FIG. 8 is a schematic circuit diagram of a fully differential first DAC unit, a fully differential redundant conversion unit, and an operational amplifier.

The current sink here may be implemented by adopting any current sink in the prior art, for example, be implemented by an N-type MOSFET, and specifically, the fourth summation point may be connected to a drain of the N-type MOSFET, a source of the N-type MOSFET is grounded, and a gate thereof is connected with a bias voltage, which is not limited in the embodiment. FIG. 8 is a schematic circuit diagram of a fully differential first DAC unit, a fully differential redundant conversion unit, and an operational amplifier.

To remove, through filtering, out-of-band noise transferred by the primary modulator and high-frequency noise generated by the charge transfer in the first digital-to-analog conversion circuit and the redundant conversion circuit, in another optional embodiment of the present invention, the digital-to-analog converter further includes a low-pass filter connected to the adder 17. In addition, because many quantization bits of the primary modulator exist, the out-of-band noise may be reduced, so as to alleviate a demand of a signal pathway for the low-pass filter.

In the embodiments of the present invention, the technical solution of cascading a secondary modulator with less quantization bits behind the primary modulator is adopted, avoiding the problem that excessive quantization bits of the primary modulator cause an increase to power consumption and an overall DAC area, and reducing non-ideal factors such as a static mismatching error of the current source and a non-ideal characteristic of a switch; and the technical solution is adopted that the second processing module processes the quantization noise signal obtained by subtracting the output signal of the secondary modulator from the output signal of the primary modulator so as to obtain the analog noise signal, and adds the analog noise signal and the first analog signal obtained from that the first processing module processes the output of the secondary modulator so as to obtain the second analog signal, so in-band noise and out-of-band noise may be reduced, so as to obtain a lower total harmonic distortion. Furthermore, in the embodiments of the present invention, by adding some simple redundant logic circuits and redundant conversion circuits, the harmonic wave caused by the charge transfer may be transferred to Fs/2, and finally be removed by the latter stage filter through filtering, thereby obtaining high signal quality. In addition, by adopting the present invention, there is no need to use a cascade current mirror device to improve an output impedance and reduce the parasitic capacitance at a drain end of the current mirror, which reduces the complexity of the circuit design, so the present invention is very suitable for working at a deep sub-micrometer and a low voltage.

Finally, it should be noted that the above embodiments are merely intended for describing the technical solutions of the present invention other than limiting the present invention. Although the present invention is described in detail with reference to the foregoing embodiments, persons skilled in the art should understand that they may still make modifications to the technical solutions described in the foregoing embodiments, or make equivalent substitutions to some or all the technical features thereof, without departing from the spirit and scope of the technical solutions of the embodiments of the present invention.

What is claimed is:

1. A digital-to-analog converter, comprising:
   a primary modulator, configured to modulate an input M-bit digital signal into an N-bit digital signal, wherein M and N are positive integers, and M>N;
   a secondary modulator, connected to the primary modulator, and configured to modulate the N-bit digital signal into a B-bit digital signal, wherein B is a positive integer, and B<N;
   a delay unit, connected to the primary modulator, and configured to delay the N-bit digital signal;
   a subtractor, connected to the delay unit and the secondary modulator separately, and configured to subtract the B-bit digital signal output by the secondary modulator from the delayed N-bit digital signal, so as to obtain an (N−B+1)-bit quantization noise signal;
   a first processing module, configured to perform decoding, dynamic matching, and digital-to-analog conversion in sequence on the B-bit digital signal output by the secondary modulator, so as to obtain a first analog signal;
   a second processing module, configured to perform decoding, dynamic matching, and digital-to-analog conversion in sequence on the (N−B+1)-bit quantization noise signal output by the subtractor, so as to obtain an analog noise signal; and
   an adder, connected to the first processing module and the second processing module separately, and configured to add the first analog signal and the analog noise signal, so as to obtain and output a second analog signal.

2. The digital-to-analog converter according to claim 1, wherein the first processing module comprises a first decoder, a first scrambler, and a first digital-to-analog conversion circuit, which are connected in sequence; and
   the first digital-to-analog conversion circuit comprises:
      a first latch, configured to output, according to a first conversion control signal output by the first scrambler, $2^B$ pairs of first control signals and second control signals, wherein in each pair, a first control signal and a second control signal are reverse to each other; and
      $2^B$ first digital-to-analog conversion units, configured to perform digital-to-analog conversion according to the $2^B$ pairs of first control signals and second control signals output by the first latch, respectively, so as to obtain the first analog signal, wherein
   each first digital-to-analog conversion unit comprises:
      a first current source, a first metal-oxide-semiconductor field-effect transistor MOSFET, and a second MOSFET, wherein the first current source is connected to sources of the first MOSFET and the second MOSFET separately through a first summation point, a drain of the first MOSFET and a drain of the second MOSFET are connected to an output positive end and an output negative end of the first digital-to-analog conversion unit respectively, gates of the first MOSFET and the second MOSFET are connected to the first latch separately to receive an input first control signal and second control signal, and the first MOSFET and the second MOSFET are negative (N type) MOSFETs with a same parameter.

3. The digital-to-analog converter according to claim 1, wherein the second processing module comprises a second decoder, a second scrambler, and a second digital-to-analog conversion circuit, which are connected in sequence; and
   the second digital-to-analog conversion circuit comprises:
      a second latch, configured to output $2^B$ pairs of third control signals and fourth control signals according to a second conversion control signal output by the second scrambler, wherein in each pair, a third control signal and a fourth control signal are reverse to each other; and
      $2^B$ second digital-to-analog conversion unit, configured to perform digital-to-analog conversion according to the $2^B$ pairs of third control signals and fourth control signals output by the second latch, respectively, so as to obtain the analog noise signal, wherein
   each second digital-to-analog conversion unit comprises:
      a second current source, a third MOSFET, and a fourth MOSFET, wherein the second current source is connected to sources of the third MOSFET and the fourth MOSFET separately through a second summation point, a drain of the third MOSFET and a drain of the fourth MOSFET are connected to an output positive end and an output negative end of the second digital-to-analog conversion unit respectively, gates of the third MOSFET and the fourth MOSFET are connected to the second latch separately to receive an input third control signal and fourth control signal, and the third MOSFET and the fourth MOSFET are negative (N type) MOSFETs with the same parameter.

4. The digital-to-analog converter according to claim 3, further comprising: $2^B$ first current-to-voltage converters and $2^B$ second current-to-voltage converters, wherein an output positive end and an output negative end of each first digital-to-analog conversion unit are connected to the adder through a corresponding first current-to-voltage converter, and an output positive end and an output negative end of each second digital-to-analog conversion unit are connected to the adder through a corresponding second current-to-voltage converter.

5. The digital-to-analog converter according to claim 4, wherein the first processing module further comprises:
   a redundant logic unit, connected to the first scrambler and the first digital-to-analog conversion circuit, and configured to perform redundant logic processing according to a conversion control signal by the first scrambler, and output a conversion control signal and a redundant control signal, wherein the conversion control signal and the redundant control signal are redundant to each other; and
   a redundant digital-to-analog conversion circuit, connected to the redundant logic unit and the first digital-to-analog conversion circuit, and comprising:
   a third latch, configured to output $2^B$ pairs of fifth control signals and sixth control signals according to the redundant control signal, wherein in each pair, a fifth control signal and a sixth control signal are reverse to each other, the fifth control signal and the first control signal are redundant to each other, and the sixth control signal and the second control signal are redundant to each other;
   $2^B$ redundant conversion units, corresponding to the $2^B$ first digital-to-analog conversion units, and configured to perform digital-to-analog conversion according to the $2^B$ pairs of fifth control signals and sixth control signals output by the third latch, respectively, so as to obtain a redundant analog signal, wherein
   each redundant conversion unit comprises:
   a third summation point in a high impedance state, a fifth MOSFET and a sixth MOSFET, wherein the third summation point is connected to sources of the fifth MOSFET and the sixth MOSFET separately, a drain of the fifth MOSFET and a drain of the sixth MOSFET are connected to an output positive end and an output negative end of a corresponding first digital-to-analog conversion unit respectively, the fifth control signal and the sixth control signal are input to a gate of the fifth MOSFET and a gate of the sixth MOSFET respectively; and
   the fifth MOSFET and the sixth MOSFET are negative (N type) MOSFETs with the same parameter as that of the first MOSFET and the second MOSFET.

6. The digital-to-analog converter according to claim 5, wherein in every preset period, a sum of times of level jumps from low to high of the fifth control signal and the first control signal is equal to 1, and a sum of times of level jumps from low to high of the sixth control signal and the second control signal is equal to 1.

7. The digital-to-analog converter according to claim 5, wherein in every preset period, a sum of times of level jumps from high to low of the fifth control signal and the first control signal is equal to 1, and a sum of times of level jumps from high to low of the sixth control signal and the second control signal is equal to 1.

8. The digital-to-analog converter according to claim 5, wherein the third summation point is connected to a drain of a seventh MOSFET, a source and a gate of the seven MOSFET are grounded, and the seventh MOSFET is a positive (P type) MOSFET.

9. The digital-to-analog converter according to claim 5, wherein the first digital-to-analog conversion unit further comprises: a current sink, an eighth MOSFET and a ninth MOSFET, wherein the current sink is connected to sources of the eighth MOSFET and the ninth MOSFET separately through a fourth summation point, a drain of the eighth MOSFET and a drain of the ninth MOSFET are connected to the output positive end and the output negative end of the first digital-to-analog conversion circuit respectively, and the second control signal and the first control signal are input to a gate of the eighth MOSFET and a gate of the ninth MOSFET respectively;
   the redundant conversion unit further comprises: a tenth MOSFET, an eleventh MOSFET, and a twelfth MOSFET, wherein a drain of the tenth MOSFET is connected to sources of the eleventh MOSFET and the twelfth MOSFET through a fifth summation point separately, a drain of the eleventh MOSFET and a drain of the tenth MOSFET are connected to the output positive end and the output negative end of the first digital-to-analog conversion circuit respectively, the sixth control signal and the fifth control signal are input to a gate of the eleventh MOSFET and a gate of the twelfth MOSFET respectively, and a source and a gate of the tenth MOSFET are grounded; and
   the eighth MOSFET, the ninth MOSFET, and the eleventh MOSFET, and the twelfth MOSFET are N-type MOSFETs with a same parameter, and the tenth MOSFET is an N-type MOSFET.

10. The digital-to-analog converter according to claim 4, further comprising a low-pass filter connected to the adder.

* * * * *